(12) United States Patent
Hubler

(10) Patent No.: US 6,392,396 B1
(45) Date of Patent: May 21, 2002

(54) ELECTROMAGNETIC INTERFERENCE PULSE GENERATOR FOR LIGHTNING TESTING OF ELECTRONIC EQUIPMENT

(75) Inventor: Frederick B. Hubler, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 55 days.

(21) Appl. No.: 09/592,875

(22) Filed: Jun. 13, 2000

(51) Int. Cl.$^7$ .............................................. G01R 31/02

(52) U.S. Cl. ...................... 324/72; 324/765; 324/158.1

(58) Field of Search .......................... 324/72, 509, 536, 324/522, 537, 127, 158.1, 765

(56) References Cited

U.S. PATENT DOCUMENTS

| | | | | |
|---|---|---|---|---|
| 3,891,917 A | * | 6/1975 | Harris | 324/382 |
| 4,243,934 A | * | 1/1981 | Brasfield | 324/72 |
| 4,520,307 A | * | 5/1985 | Weiss et al. | 324/558 |
| 4,665,476 A | * | 5/1987 | Masuda | 96/25 |
| 5,319,515 A | * | 6/1994 | Pryor et al. | 361/93.4 |
| 5,447,103 A | * | 9/1995 | McIlroy | 102/206 |
| 5,675,260 A | * | 10/1997 | Consiglio | 324/763 |
| 5,834,940 A | * | 11/1998 | Brooks et al. | 324/424 |
| 5,973,604 A | * | 10/1999 | Eslambochi et al. | 340/635 |
| 5,990,654 A | * | 11/1999 | Skibinski et al. | 318/800 |

OTHER PUBLICATIONS

F. A. Fisher, R. A. Perala and J. A. Plumer, "Lightning Protection Of Aircraft", Lightning Technologies, Inc., 1990, pp. 470–474.

* cited by examiner

Primary Examiner—Safet Metjahic
Assistant Examiner—T. R. Sundaram
(74) Attorney, Agent, or Firm—Nathan O. Jensen; Kyle Eppele

(57) ABSTRACT

A transient pulse generator, for generating high energy RF pulses for lightning testing electronic equipment, generates control pulses. An insulated gate bipolar junction transistor (IGBT) is coupled to the conducts in response to the control pulses. A first capacitor is coupled to an electrode of the IGBT and to a first voltage potential. A transformer has its primary coupled between the first capacitor and a second electrode of the IGBT such that when the IGBT is not conducting the first capacitor is charged to a difference between the first and second voltage potentials. When the IGBT is switched into conduction mode the first capacitor discharges across the primary of the transformer, resulting in generation of a pulse across the secondary of the transformer. A second capacitor is coupled between a third voltage potential and an injection core which provides magnetic coupling to the equipment to be tested. The second capacitor charges to substantially the third voltage potential between control pulses. A spark gap device has a trigger electrode coupled to the secondary of the transformer, an adjacent electrode coupled to third voltage potential and to the second capacitor, and an opposite electrode coupled to ground such that a pulse generated across the secondary of the transformer triggers the spark gap thereby discharging the second capacitor and providing a high energy RF pulse to the injection core for coupling to the electronic equipment.

15 Claims, 3 Drawing Sheets

TABLE 1

| COMPONENT | VALUE |
|---|---|
| R1 | 247 Ohms |
| R2 | 750 Ohms |
| R3 | 1.5 K Ohms |
| R4 | 10 Ohms |
| R5 | 100 Ohms |
| R6 | 1 M Ohm |
| C1 | 330 PF |
| C2 | 330 PF |
| C3 | 0.1 µF |
| C4 | 470 PF |
| C5 | 2000 PF |
| C6 | 100 PF |
| Q1 | 2N2222A |
| Q2 | 2N2907A |
| Q3 | International Rectifier IGBT part number IRG4PH50U |
| X1 | Perkin Elmer part number TR-1700 |
| G1 | Perkin Elmer part number GP-86 |
| L1 | 16 µH |

FIG. 3

ELECTROMAGNETIC INTERFERENCE PULSE GENERATOR FOR LIGHTNING TESTING OF ELECTRONIC EQUIPMENT

FIELD OF THE INVENTION

The present invention relates generally to lightning testing of electronic equipment. More particularly, the present invention relates to a circuit for generating a sequence of high energy radio frequency (RF) pulses for use in lightning testing.

BACKGROUND OF THE INVENTION

In certain electronic industries, for example the aviation electronics (avionics) industry, it is frequently necessary to lightning test electronic equipment to verify that the equipment will remain operational after a lightning strike. Testing for lightning induced multiple-burst transient susceptibility presents several problems. In addition to the difficulty of being capable of applying high voltage pulses to electrical cabling connected to the electronic equipment under test, the lightning test circuitry must in some instances be capable of providing as many as 24 or more RF pulses within a short period of time, for example during as little as a two second period. Designing a transient pulse generator which is capable of handling high voltage potentials and which can provide many transient pulses in a short period of time has proven problematic.

SUMMARY OF THE INVENTION

A transient pulse generator, for generating high energy RF pulses for lightning testing electronic equipment, generates control pulses. An insulated gate bipolar junction transistor (IGBT) is coupled to the conducts in response to the control pulses. A first capacitor is coupled to an electrode of the IGBT and to a first voltage potential. A transformer has its primary coupled between the first capacitor and a second electrode of the IGBT such that when the IGBT is not conducting the first capacitor is charged to a difference between the first and second voltage potentials. When the IGBT is switched into conduction mode the first capacitor discharges across the primary of the transformer, resulting in generation of a pulse across the secondary of the transformer. A second capacitor is coupled between a third voltage potential and an injection core which provides magnetic coupling to the equipment to be tested. The second capacitor charges to substantially the third voltage potential between control pulses. A spark gap device has a trigger electrode coupled to the secondary of the transformer, an adjacent electrode coupled to third voltage potential and to the second capacitor, and an opposite electrode coupled to ground such that a pulse generated across the secondary of the transformer triggers the spark gap thereby discharging the second capacitor and providing a high energy RF pulse to the injection core for coupling to the electronic equipment.

BRIEF DESCRIPTION OF THE DRAWINGS

FIG. 3 is a table which illustrates possible component values for the electrical components shown in the schematic circuit diagram of FIG. 2, in accordance with one embodiment of the invention.

DETAILED DESCRIPTION OF AN ILLUSTRATIVE EMBODIMENT

Figure 1:
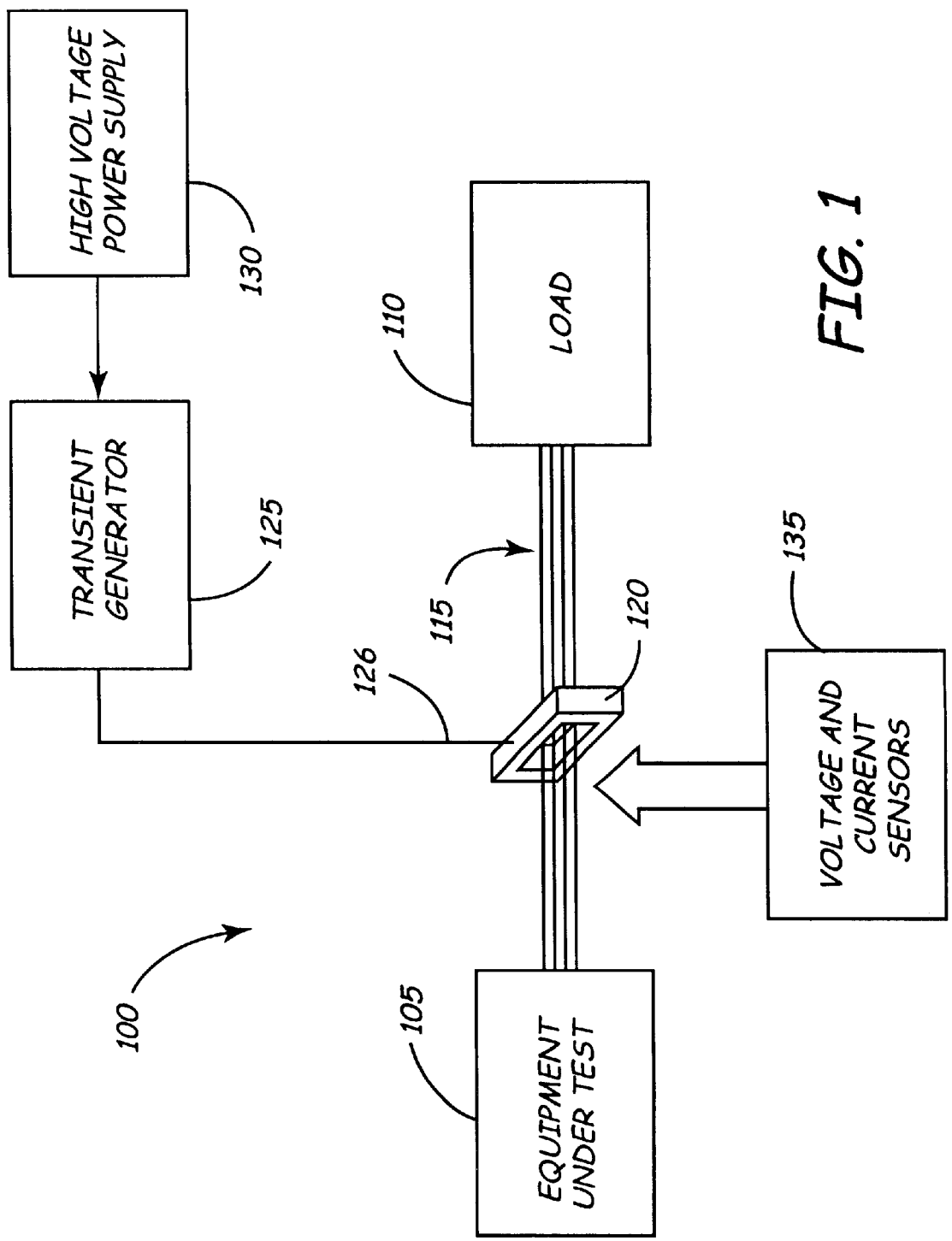
FIG. 1 is a block diagram illustrating a lightning test system for testing electronic equipment.

FIG. 1 is a block diagram which illustrates lightning test system 100 utilizing a transient generator 125 of the present invention. In addition to transient generator 125, system 100 includes load 110, electric cable bundle 115, injection core or core assembly 120, high voltage power supply 130 and voltage and current sensors 135. In order to test electronic equipment 105, the equipment is connected to load 110 using cable bundle 115. Load 110, for example, can represent an antenna coupler or other loads which would be associated with equipment under test 105 in an avionics environment.

Electric cabling 115 is passed through injection core or core assembly 120 to provide magnetic coupling of transient generator 125 to injection core 120, cabling 115 and equipment under test 105, as is known in the art. Although not shown, coupling of generator 125 to core 120 can be done with a single turn of electric cable or coil 126 around the core. Using one or more high voltage potentials from high voltage power supply 130, transient generator 125 generates the multiplicity of high voltage transient pulses which are coupled through injection core assembly 120 to equipment under test 105. Voltage and current sensors 135 are used to monitor voltage and current peaks on cabling 115.

Figure 2:
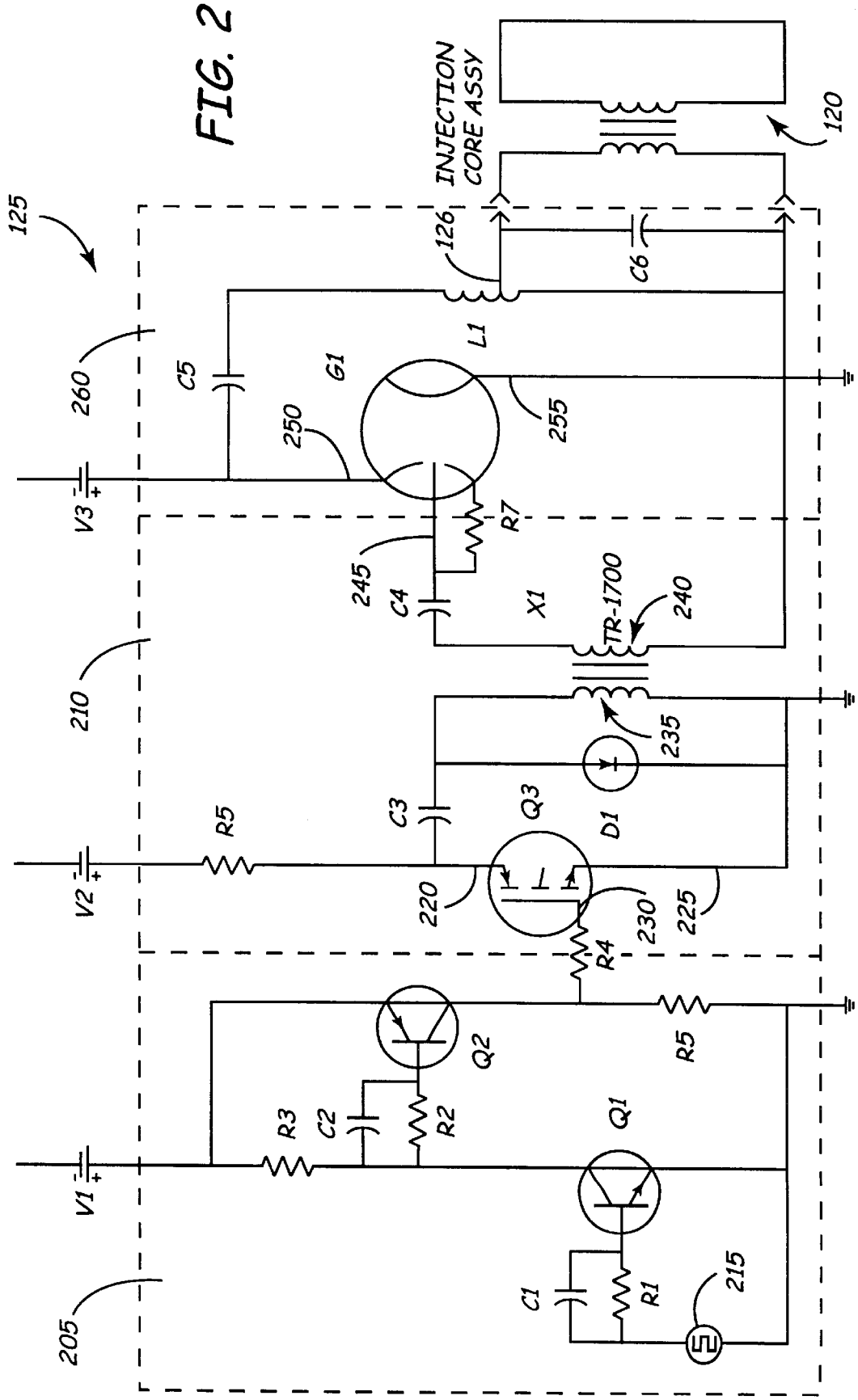
FIG. 2 is a schematic circuit diagram of a transient generator in accordance with the present invention.

In accordance with the invention, transient pulse generator 125 is provided as shown in FIG. 2. As shown in FIG. 2, transient pulse generator 125 includes control pulse generator 205 spark gap trigger circuitry 210, and transient generating circuitry 260. Transient pulse generator 125 utilizes voltage potentials V1, V2 and V3, which can be provided by high voltage power supply 130 or by other sources. In an exemplary embodiment, voltage potential V1 is a 15V potential, voltage potential V2 is a 400V potential, and voltage potential V3 is a 15 KV potential. As illustrated, a fourth potential used is the ground potential, but this potential can be a non-ground potential if desired.

In the embodiment illustrated in FIG. 2, control pulse generator 205 includes arbitrary waveform generator 215, capacitors C1 and C2, resistors R1, R2, R3, R4 and R5, and bipolar junction transistors (BJTs) Q1 and Q2. Arbitrary waveform generator 215 generates low voltage (for example 5V maximum amplitude) randomly spaced pulses. Transistors Q1 and Q2 are configured, along with resistors R1, R2, R3 and R5 and capacitors C1 and C2 to provide control pulses at the collector electrode of transistor Q2, and thus at an output of control pulse generator 205 provided at resistor R4. The control pulses provided at the output of control pulse generator 205 are amplified versions of the randomly spaced pulses provided by arbitrary waveform generator 215, but in the illustrated embodiment, have the same polarity and spacing. In the illustrated embodiment, if the arbitrary waveform generator provides 5V pulses, the pulses provided at the output of generator 205 will be 15V.

Spark gap trigger circuitry 210 includes transistor Q3, which is an insulated gate bipolar junction transistor (IGBT). It is important to use this device because few switching devices have been found to be capable of repetitively switching high levels of current as quickly as required in the transient pulse generation of the present invention. Trigger circuitry 210 also includes resistors R6 and R7, capacitors C3 and C4, diode D1, and transformer X1. Transient generator 260 includes capacitors C5 and C6, spark gap G1 and inductor L1. Transistor Q3 has a first electrode 220 coupled to a voltage potential V2 through resistor R6, a second electrode 225 coupled to the ground potential, and a control electrode 230 coupled to the control pulse generator 205 such that each of the control pulses from generator 205 causes IGBT transistor Q3 to conduct. Voltage supply V1 must have a potential sufficient to fully turn on IGBT transistor Q3. Capacitor C3 is coupled between electrode 220 of transistor Q3 and one side of primary 235 of transformer X1. The second side of primary 235 of transformer X1 is coupled to second electrode 225 of transistor Q3 such that when transistor Q3 is not conducting, capacitor C3 is charged to a difference between voltage potential V2 and ground. When IGBT transistor Q3 is switched into conduction mode by a control pulse, capacitor C3 discharges across primary 235, resulting in generation of a corresponding pulse across secondary 240 of transformer X1. Diode D1 prevents current from flowing through primary 235 of transformer X1 while capacitor C3 is charging, and thus prevents false triggering of the spark gap. The potential of voltage supply V2 depends on the particular trigger transformer chosen and in this embodiment is as recommended on the trigger transformer vendor data sheet.

Capacitor C5 of transient generator 260 has a first electrode coupled to voltage potential V3 and a second electrode coupled to inductor L1. Inductor L1 is coupled between capacitor CS and ground, with injection core assembly 120 being coupled to a tap of inductor L1. Capacitor C5 therefore charges to substantially the same voltage as voltage potential V3. Spark gap device GI has a trigger electrode 245 coupled to secondary 240 of transformer X1, an adjacent electrode 250 coupled to voltage potential V3 and to the first electrode of capacitor C5, and an opposite electrode 255 coupled to ground. A pulse generated across the secondary 240 of transformer X1 triggers spark gap G1, lowering the potential of adjacent electrode 250 from voltage potential V3 to substantially the ground potential of opposite electrode 255. This in turn results in capacitor C5 discharging across inductor L1, providing a high energy RF pulse to injection core 120 for coupling the RF pulse to electronic equipment under test 105. In one embodiment, core 120 is connected via line 126 to a tap on inductor L1 which results in 25 percent of voltage potential V3 being pulsed across core assembly 120.

If the output circuitry of voltage supply V3 cannot withstand to be substantially grounded by spark gap G1, it would be necessary to de-couple the voltage supply V3 from transient generator 260 with a resistor (not included in the embodiment of FIG. 2). A similar function is provided by resistor R6 in trigger circuitry 210, with respect to voltage supply V2. Capacitor charging power supplies are available that are suitable for this purpose.

Capacitor C4 and resistor R7 are coupled to trigger electrode 245 and act to pass the triggering pulse from secondary 240 of transformer X1, and to discharge potential between the trigger electrode 245 and the adjacent electrode 240 of spark gap G1 after the RF pulse has dissipated. Capacitor C6 is coupled across the injection core assembly 120 and has been found to dampen oscillations (i.e., ringing) at undesired frequencies.

FIG. 3 shows TABLE 1 which demonstrates component types and values of components illustrated in FIG. 2. The types and values of components illustrated in TABLE 1 are for an exemplary embodiment. However, the present invention is not limited to the component types and values illustrated in TABLE 1 shown in FIG. 3.

Although the present invention has been described with reference to illustrative embodiments, workers skilled in the art will recognize that changes may be made in form and detail without departing from the spirit and scope of the invention.

What is claimed is:

1. A transient pulse generator for generating high energy radio frequency pulses for lightning testing electronic equipment, the pulse generator comprising:
   a control pulse generator providing control pulses;
   an insulated gate bipolar junction transistor (IGBT) having a first electrode coupled to a first voltage potential, a second electrode coupled to a second voltage potential, and a control electrode coupled to the control pulse generator such that each of the control pulses cause the IGBT to conduct;
   a first capacitor having a first electrode coupled to the first electrode of the IGBT;
   a transformer having its primary coupled between a second electrode of the first capacitor and the second electrode of the IGBT such that when the IGBT is not conducting the first capacitor is charged to a difference between the first and second voltage potentials, and such that when the IGBT is switched into conduction mode the first capacitor discharges across the primary of the transformer, resulting in generation of a pulse across the secondary of the transformer;
   a second capacitor having a first electrode coupled to a third voltage potential and a second electrode coupled to an injection core which is adapted to provide magnetic coupling to the electronic equipment to be tested, wherein the second capacitor charges to substantially the third voltage potential;
   an inductor coupled between the second capacitor and the second voltage potential; and
   a spark gap device having a trigger electrode coupled to the secondary of the first transformer, an adjacent electrode coupled to the third voltage potential and to the first electrode of the second capacitor, and an opposite electrode coupled to the second voltage potential, wherein the pulse generated across the secondary of the transformer triggers the spark gap thereby substantially grounding the first electrode of the second capacitor, which establishes an under damped resonant circuit with the second capacitor, the inductor and the injection core assembly for coupling to the electronic equipment.

2. The transient pulse generator of claim 1, wherein the injection core is coupled to one of a plurality of coil turns of the inductor, thereby providing a high energy radio frequency pulse to the injection core for coupling to the electronic equipment.

3. The transient pulse generator of claim 2, wherein the inductor and the second capacitor form a tank circuit which is resonant to a desired frequency of the radio frequency pulses.

4. The transient pulse generator of claim 3, and further comprising a diode coupled across the primary of the transformer to thereby prevent discharge of the first capacitor across the primary prior to switching of the IGBT into conduction mode by a control pulse.

5. The transient pulse generator of claim 3, wherein the control pulse generator is adapted to provide the control pulses at randomly spaced intervals.

6. The transient pulse generator of claim 5, wherein the control pulse generator further comprises an arbitrary waveform generator adapted to generate randomly spaced pulses, and an amplifier circuit coupled to the arbitrary waveform generator adapted to amplify the randomly spaced pulses to provide the control pulses.

7. The transient pulse generator of claim 6, wherein the second voltage potential is a ground potential and wherein the third voltage potential is within the triggerable range of the spark gap, and less than a static or self breakdown voltage of the spark gap, and is adjusted to the level required to generate the required test levels at the voltage and current sensors.

8. A transient pulse generator for generating high energy radio frequency pulses for lightning testing electronic equipment, the pulse generator comprising:

control pulse means for providing control pulses;

an insulated gate bipolar junction transistor (IGBT) having a first electrode coupled to a first voltage potential, a second electrode coupled to a second voltage potential, and a control electrode coupled to the control pulse means such that each of the control pulses cause the IGBT to conduct;

first energy storage means for storing energy, the first energy storage means being coupled to the first electrode of the IGBT;

a transformer having its primary coupled between the first energy storage means and the second electrode of the IGBT such that when the IGBT is not conducting the first energy storage means is charged to a difference between the first and second voltage potentials, and such that when the IGBT is switched into conduction mode the first energy storage means discharges across the primary of the transformer, resulting in generation of a pulse across the secondary of the transformer;

second energy storage means for storing energy, the second energy storage means being coupled to a third voltage potential and to an injection core which is adapted to provide magnetic coupling to the electronic equipment to be tested;

an inductor coupled between the second energy storage means and the second voltage potential; and spark gap means for selectively coupling the second, energy storage means to the second voltage potential, the spark gap means being coupled to the secondary of the first transformer, wherein the pulse generated across the secondary of the transformer triggers the spark gap means thereby substantially coupling the second energy storage means to the second voltage potential, which establishes an under damped resonant circuit with the second energy storage means, the inductor and the injection core assembly for coupling to the electronic equipment.

9. The transient pulse generator of claim 8, wherein the injection core is coupled to one of a plurality of coil turns of the inductor, thereby providing a high energy radio frequency pulse to the injection core for coupling to the electronic equipment.

10. The transient pulse generator of claim 9, wherein the inductor and the second energy storage means form a tank circuit which is resonant to a desired frequency of the radio frequency pulses.

11. The transient pulse generator of claim 10, and further comprising a diode coupled across the primary of the transformer to thereby prevent charging of the first energy storage means from prematurely triggering the spark gap.

12. The transient pulse generator of claim 10, wherein the control pulse means is adapted to provide the control pulses at randomly spaced intervals.

13. The transient pulse generator of claim 12, wherein the control pulse means further comprises an arbitrary waveform generator adapted to generate randomly spaced pulses, and an amplifier circuit coupled to the arbitrary waveform generator adapted to amplify the randomly spaced pulses to provide the control pulses.

14. The transient pulse generator of claim 13, wherein the spark gap means comprises a spark gap.

15. The transient pulse generator of claim 14, wherein the second voltage potential is a ground potential and wherein the third voltage potential is within the triggerable range of the spark gap, and less than a static or self breakdown voltage of the spark gap, and is adjusted to the level required to generate the required test levels at the voltage and current sensors.

* * * * *